United States Patent
Kanawati

(10) Patent No.: US 10,672,885 B2
(45) Date of Patent: Jun. 2, 2020

(54) SILICIDE BLOCK ISOLATION FOR REDUCING OFF-CAPACITANCE OF A RADIO FREQUENCY (RF) SWITCH

(71) Applicant: Newport Fab, LLC, Newport Beach, CA (US)

(72) Inventor: Roda Kanawati, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 15/788,681

(22) Filed: Oct. 19, 2017

(65) Prior Publication Data

US 2019/0123166 A1 Apr. 25, 2019

(51) Int. Cl.
| | | |
|---|---|---|
| *H01L 29/66* | (2006.01) | |
| *H01L 27/12* | (2006.01) | |
| *H01L 29/45* | (2006.01) | |
| *H01L 29/49* | (2006.01) | |
| *H01L 29/78* | (2006.01) | |

(Continued)

(52) U.S. Cl.
CPC ...... *H01L 29/665* (2013.01); *H01L 21/28052* (2013.01); *H01L 21/28518* (2013.01); *H01L 21/76895* (2013.01); *H01L 21/84* (2013.01); *H01L 23/535* (2013.01); *H01L 23/66* (2013.01); *H01L 27/1203* (2013.01); *H01L 29/0653* (2013.01); *H01L 29/0696* (2013.01); *H01L 29/41758* (2013.01); *H01L 29/4238* (2013.01); *H01L 29/456* (2013.01);

(Continued)

(58) Field of Classification Search
CPC ..... H01L 23/535; H01L 23/66; H01L 23/665; H01L 29/665; H01L 29/78615; H01L 29/4238
See application file for complete search history.

(56) References Cited

U.S. PATENT DOCUMENTS 6,084,255 A * 7/2000 Ueda ................... H01L 27/0207
257/204
6,624,459 B1 * 9/2003 Dachtera ............... G11C 11/412
257/296

(Continued)

OTHER PUBLICATIONS

Sze et al., Physics of Semiconductor Devices, John Wiley & Sons, Inc. 2007, pp. 340-341.*

(Continued)

*Primary Examiner* — Cuong Q Nguyen
*Assistant Examiner* — Shih Tsun A Chou
(74) *Attorney, Agent, or Firm* — Bever, Hoffman & Harms, LLP

(57) ABSTRACT

A silicon-on-insulator (SOI) CMOS transistor structure includes a plurality of series-connected SOI CMOS transistors, including a plurality of parallel source/drain regions, a plurality of channel/body regions located between the plurality of source/drain regions, and a polysilicon gate structure located over the plurality of channel regions. The polysilicon gate structure includes a plurality of polysilicon gate fingers, wherein each polysilicon gate finger extends over a corresponding one of the channel/body regions. A silicide blocking structure is formed over portions of the polysilicon gate fingers, wherein channel/body contact regions, which extend at least partially under the silicide blocking structure, provide electrical connections to the parallel channel/body regions.

8 Claims, 12 Drawing Sheets

(51) Int. Cl.
    *H01L 23/66*    (2006.01)
    *H01L 29/06*    (2006.01)
    *H01L 21/285*   (2006.01)
    *H01L 21/28*    (2006.01)
    *H01L 21/768*   (2006.01)
    *H01L 23/535*   (2006.01)
    *H01L 21/84*    (2006.01)
    *H01L 29/417*   (2006.01)
    *H01L 29/423*   (2006.01)

(52) U.S. Cl.
    CPC .... H01L 29/4933 (2013.01); H01L 29/66492 (2013.01); H01L 29/7833 (2013.01)

(56) References Cited

U.S. PATENT DOCUMENTS

| | | |
|---|---|---|
| 9,190,479 B1 | 11/2015 | Greenberg |
| 9,620,640 B2* | 4/2017 | Hung .................... H01L 29/783 |
| 2003/0141543 A1* | 7/2003 | Bryant ............... H01L 29/66772 257/347 |
| 2009/0039429 A1* | 2/2009 | Huang ............... H01L 29/42384 257/348 |
| 2009/0315080 A1* | 12/2009 | Stribley .............. H01L 27/0203 257/208 |
| 2012/0205744 A1* | 8/2012 | O .......................... H01L 21/266 257/352 |
| 2015/0041917 A1* | 2/2015 | Zhu .................... H01L 27/0207 257/392 |
| 2017/0287836 A1* | 10/2017 | Wang ................. H01L 23/4825 |
| 2018/0114801 A1* | 4/2018 | Leipold ................ H01L 27/13 |
| 2019/0067476 A1* | 2/2019 | Mori ................... H01L 29/7835 |

OTHER PUBLICATIONS

Sze et al., Physics of Semiconductor Devices, Third Edition, John Wiley & Sons, Inc. pp. 343-344 (Year: 2007).*

* cited by examiner

SILICIDE BLOCK ISOLATION FOR REDUCING OFF-CAPACITANCE OF A RADIO FREQUENCY (RF) SWITCH

FIELD OF THE INVENTION

The present invention relates to a semiconductor structure including a plurality of series-connected silicon-on-insulator (SOI) CMOS transistors, which can be used to implement a radio frequency (RF) switch. More specifically, the present invention relates to the use of a silicide blocking structure to reduce the off-capacitance of SOI CMOS transistors used to implement an RF switch.

RELATED ART

FIG. 1 is a circuit diagram of a conventional radio frequency (RF) circuit 100, including an antenna 101, an RF receiver switch 110, an RF receiver port 115, an RF transmitter switch 120 and an RF transmitter port 125. RF receiver switch 110 includes a plurality of high-voltage field effect transistors (FETs) $110_1$-$110_N$, which are connected in series (in a stack). The stack of high voltage FETs $110_1$-$110_N$ is controlled to route RF signals from antenna 101 to receive port 115. Similarly, RF transmitter switch 120 includes a stack of high-voltage FETs $120_1$-$120_N$, which are controlled to route RF signals from transmit port 125 to antenna 101. As used herein, an RF signal is defined as a signal having a frequency in the range of about 10 kHz to 50 GHz. The FETs used in the switch branch stack are large, typically 1-5 mm (millimeter) in total width. It is understood that FIG. 1 is a simplified schematic for illustrative purposes and that many features of a full RF switch product related to biasing, voltage balance, etc., are not shown.

Silicon-on-insulator (SOI) CMOS technologies are now the dominant platforms for creating best-in-class radio frequency switch (RFSW) products for handsets and other mobile devices. Thus, transistors $110_1$-$110_N$ and $120_1$-$120_N$ are typically implemented using SOI CMOS transistors. Such SOI CMOS transistors enable the associated RF switches 110 and 120 to transmit RF signals in the range of 0.5 GHz to 6 GHz with a high degree of linearity, while withstanding voltages of 40V to 70V and in an off-state. Because SOI CMOS technology uses standard CMOS technologies and standard cell libraries, RF switches that implement SOI CMOS transistors can be readily integrated into larger system-on-chip (SOC) devices, thereby minimizing fabrication costs. For example, transistors $110_1$-$110_N$ and $120_1$-$120_N$ and transistors associated with receive port 115 and transmit port 125 may be fabricated on the same integrated circuit chip.

As described herein, an SOI CMOS technology includes any process that can be used to fabricate SOI CMOS transistors. Thus, a process that can be used to integrate the fabrication of both SOI CMOS transistors and other types of transistors (e.g., SiGe BiCMOS transistors) is considered to be an SOI CMOS process.

For RF switch 110 (or 120), the on-resistance of the switch ($R_{ON}$) multiplied by the off-capacitance of the switch ($C_{OFF}$) is a key figure of merit, which dictates the ability to transmit RF power with low losses through on-state transistor stacks, while maintaining adequate isolation across off-state transistor stacks. The thin film SOI CMOS transistors are attractive for RF switch applications, because these transistors reduce the junction capacitance component of the off-capacitance value, $C_{OFF}$.

Typically, the off-state stacks of an RF switch need to hold off relatively high voltage RF signals (e.g., 40-70 V). Consequently, RF switches are implemented with older generation SOI CMOS transistors having operating voltages in the 2.5 Volt-5 Volt range. These older generation SOI CMOS transistors are fabricated using process nodes with a minimum feature size of 0.18 microns or greater. In general, the gate length of each of transistors $110_1$-$110_N$ and $120_1$-$120_N$ must be about 0.18 microns or more to provide the required off-state isolation. Note that transistors fabricated using more advanced process nodes (e.g., a 0.13 micron process node) have lower operating voltages (e.g., 1.2 Volts or lower), and are typically not suitable for implementing an RF switch.

FIG. 2A is a top view of a conventional SOI CMOS structure 200, which includes n-channel SOI CMOS transistors 201-203, which are fabricated in an active semiconductor region 210 using a conventional 0.18 micron SOI CMOS process node. FIGS. 2B, 2C and 2D are cross-sectional views of SOI CMOS structure 200 along section lines B-B, C-C and D-D, respectively, of FIG. 2A. Note that not all of the elements of SOI CMOS structure 200 are shown in FIG. 2A for clarity. Transistors similar to n-channel SOI CMOS transistors 201-203 can be used to implement transistors $110_1$-$110_N$ and $120_1$-$120_N$ of RF switches 110 and 120.

Polysilicon gate structure 230 includes a plurality of rectangular polysilicon gate fingers 231-233, which are joined by a rectangular polysilicon base region 234. The rectangular gate fingers 231-233 extend in parallel with one another. The rectangular base region 234 is located perpendicular to the gate fingers 231-233, such that 90 degree angles are formed where the gate fingers 231-233 meet the base region 234. Although gate fingers 231-233 and gate base region 234 are illustrated as distinct rectangles in FIG. 2A, it is understood that gate fingers 231-233 and gate base region 234 are a single continuous polysilicon element.

As illustrated by FIG. 2B, SOI CMOS transistors 201-203 are fabricated on a SOI structure that includes thin silicon layer 206, which is located on a buried insulating layer 205 (e.g., silicon oxide), which in turn, is located on a substrate 204 (e.g., monocrystalline silicon).

N-channel SOI CMOS transistor 201 includes an n-type source/drain region 211 (which includes lightly doped source/drain region 211A and source/drain contact region 211B), an n-type source/drain region 212 (which includes lightly doped source/drain region 212A and source/drain contact region 212B), gate dielectric 221, polysilicon gate finger 231, dielectric sidewall spacers 241-242 and metal silicide regions 251-253. A p-type channel/body region 215 exists between the source/drain region 211 and the source/drain region 212.

N-channel SOI CMOS transistor 202 includes an n-type source/drain region 212 (which includes lightly doped source/drain region 212C and source/drain contact region 212B), an n-type source/drain region 213 (which includes lightly doped source/drain region 213A and source/drain contact region 213B), gate dielectric 222, polysilicon gate finger 232, dielectric sidewall spacers 243-244 and metal silicide regions 253-255. A p-type channel/body region 216 exists between the source/drain region 212 and the source/drain region 213.

N-channel SOI CMOS transistor 203 includes an n-type source/drain region 213 (which includes lightly doped source/drain region 213C and source/drain contact region 213B), an n-type source/drain region 214 (which includes lightly doped source/drain region 214A and source/drain contact region 214B), gate dielectric 223, polysilicon gate finger 233, dielectric sidewall spacers 245-246 and metal silicide regions 255-257. A p-type channel/body region 217 exists between the source/drain region 213 and the source/drain region 214. To implement a typical RF switch, each of the polysilicon gate fingers 231-233 has a length ($L_G$) of 0.18 microns or more. Electrical contacts 281-283 to gate fingers 231-233 are provided outside the active region 210 of the semiconductor structure 200.

A multi-layer interconnect structure is fabricated over transistors 201-203, thereby providing electrical connections to these transistors (and other devices fabricated in the thin silicon layer 206). In the example illustrated, a pre-metal dielectric (PMD) structure 260 is formed over transistors 201-203. Metal contacts, such as contacts 261-265 (which are illustrated as squares containing an "X" in FIG. 2A), extend through the PMD structure 260 and contact the silicide regions 251, 253, 255, 257 and 251, respectively, as illustrated. Metal contacts 281-283 extend through the PMD structure 260 and contact the metal silicide regions 252, 254 and 256, respectively (enabling biasing of polysilicon gate fingers 231-233). A first metal layer (M1), including metal traces 271-276, is formed over PMD structure 260. Additional dielectric layers, metal vias and metal layers (not shown) are formed over the PMD structure 260 and the first metal layer (M1) in a manner known in the art.

As illustrated by FIGS. 2A, 2C and 2D, p-type channel/body regions 215-217 of transistors 201-203 can be biased via a continuous p-type body region 218 (which is located under rectangular polysilicon region 234, and is continuous with the p-type channel/body regions 215-217), a heavily doped p-type body contact region 219, metal contacts 266-268, and metal trace 275. The gate dielectric region 224 (which is continuous with gate dielectric regions 221-223) is located under rectangular polysilicon region 234. Sidewall dielectric spacer 241 continues along the left edge of polysilicon region 234, as illustrated. Sidewall dielectric spacer 248 is located along the right edge of polysilicon region 234. Silicide region 258 (which is continuous with silicide regions 252, 254 and 256) is located over polysilicon region 234. Silicide region 259 is formed over p-type body contact region 219. Metal contact 266 (as well as metal contacts 267-268) contacts the silicide region 259. Metal trace 275 joins the metal contacts 266-268. Metal contact 265 extends between the metal trace 271 and the silicide region 251, as illustrated.

As illustrated by FIG. 2C, portions of the lightly doped source/drain region 211A extend under the left edge of polysilicon region 234. This configuration exists along the entire length of the left edge of the polysilicon region 234 (within the active region 210). FIG. 2E is a simplified top view of SOI CMOS structure 200, which illustrates active region 210 and polysilicon gate structure 230 (including polysilicon gate fingers 231-233 and rectangular polysilicon region 234). Shaded regions 290-299 represent the overlap regions where the polysilicon gate structure 230 extends over the underlying lightly doped source/drain regions 211A, 212A, 212C, 213A, 213C and 214A. Thus, overlap regions 290-291, 292-293 and 294-295 exist under polysilicon gate fingers 231, 232 and 233, respectively. Overlap regions 296-299 exist under rectangular polysilicon region 234. The overlap regions 296-299 under rectangular polysilicon region 234 undesirably adds to the overlap capacitance (and therefore the off-capacitance ($C_{OFF}$)) of the SOI CMOS structure 200. However, this rectangular polysilicon region 234 is required for the formation of p-type regions 218-219, which in turn, are required to enable the biasing of the p-type channel/body regions 215-217.

It would therefore be desirable to have an improved SOI CMOS transistor structure for implementing an RF switch. It would be desirable for the improved SOI CMOS transistor structure to exhibit a relatively small $R_{ON} \times C_{OFF}$ value, while maintaining a relatively large breakdown voltage. It would further be desirable if this improved SOI CMOS transistor structure can be fabricated using conventional fabrication process nodes.

SUMMARY

Accordingly, the present invention provides a SOI CMOS transistor structure for use in a radio frequency (RF) switch, wherein the transistor structure eliminates the overlap capacitance associated with the overlap regions 296-299 described above. In accordance with one embodiment, an SOI CMOS transistor of the present invention includes an active semiconductor region located on a buried dielectric layer. The active semiconductor region includes a plurality of source/drain regions having a first conductivity type, separated by a plurality of channel/body regions having a second conductivity type. A plurality of channel/body contact regions having the second conductivity type are continuous with first ends of the plurality of channel/body regions, thereby providing paths for biasing the channel/body regions. A plurality of polysilicon gate fingers extend over the plurality of channel/body regions. A silicide blocking structure extends over portions of the channel/body contact regions and over portions of the polysilicon gate fingers. The silicide blocking structure prevents the formation of metal silicide on the underlying portions of the channel/body contact regions and the underlying portions of the polysilicon gate fingers. The overlap capacitance of this SOI CMOS transistor structure is reduced with respect to a conventional SOI CMOS transistor structure 200, because the silicide blocking structure results in the elimination of the overlap regions 296-299 of the conventional SOI CMOS transistor structure.

In another embodiment, a method for fabricating the above-described SOI CMOS transistor structure is provided. This method includes (1) forming a plurality of polysilicon gate electrodes over an active region of a silicon-on-insulator structure, (2) forming a plurality of source/drain regions having a first conductivity type between the plurality of polysilicon gate electrodes, wherein a plurality of channel/body regions having a second conductivity type exist between the plurality of source/drain regions, under the polysilicon gate electrodes, (3) forming a first plurality of contact regions having the second conductivity type, wherein the first plurality of contact regions are continuous with first ends of the plurality of channel/body regions, (4) forming a silicide blocking structure that covers first portions of the first plurality of contact regions, adjacent first portions of the source/drain regions, and first portions of each of the plurality of polysilicon gate fingers, and then (5) forming metal silicide regions over portions of the plurality of source/drain regions, portions of the first plurality of contact regions and portions of the polysilicon gate electrodes that are not covered by the silicide blocking structure.

The present invention will be more fully understood in view of the following description and drawings.

DETAILED DESCRIPTION

In general, the present invention includes an improved semiconductor structure for implementing a plurality of n-channel SOI CMOS transistors connected in series. In one embodiment, the series-connected SOI CMOS transistors are used to implement an RF switch.

The n-channel SOI CMOS transistors are fabricated in accordance with a conventional SOI CMOS process node. In accordance with the present invention, the polysilicon region 234 of the prior art is effectively replaced with a silicide blocking structure, thereby reducing the off-capacitance ($C_{OFF}$) of the associated RF switch. The alternating current (AC) breakdown voltages of the associated transistors are maintained. The present invention is described in more detail below.

Figure 1:
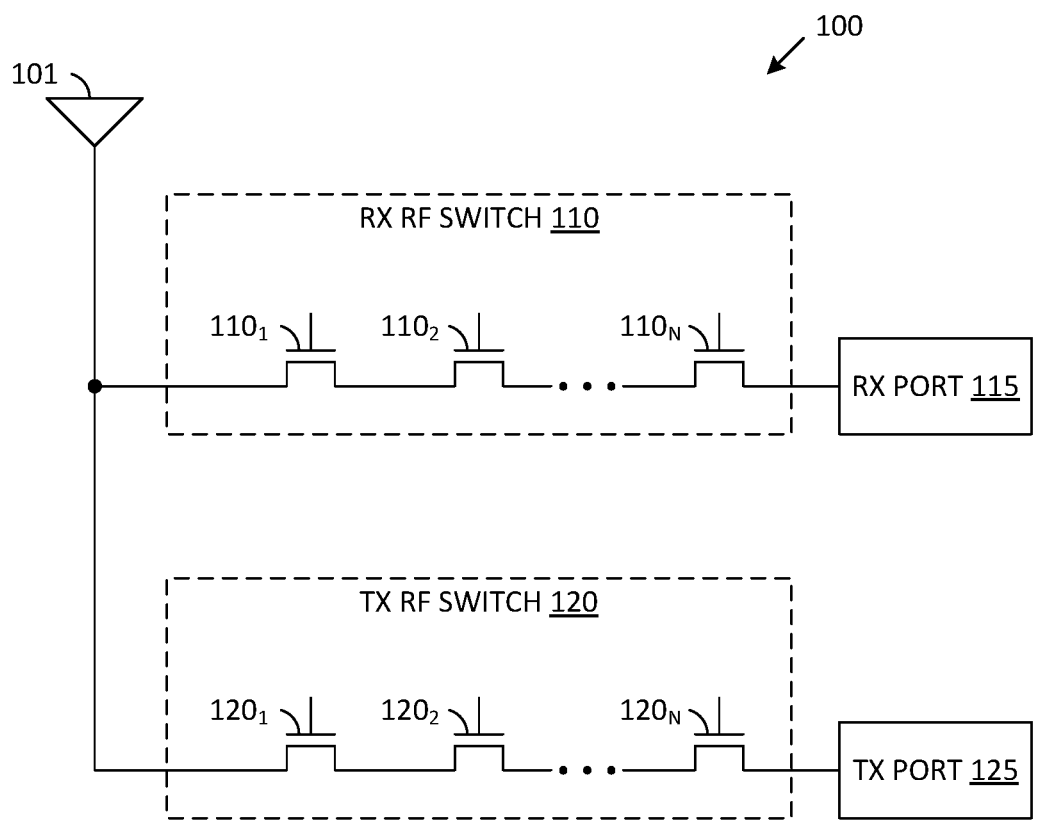
FIG. 1 is a circuit diagram of a conventional RF switch structure.
Figure 2A:
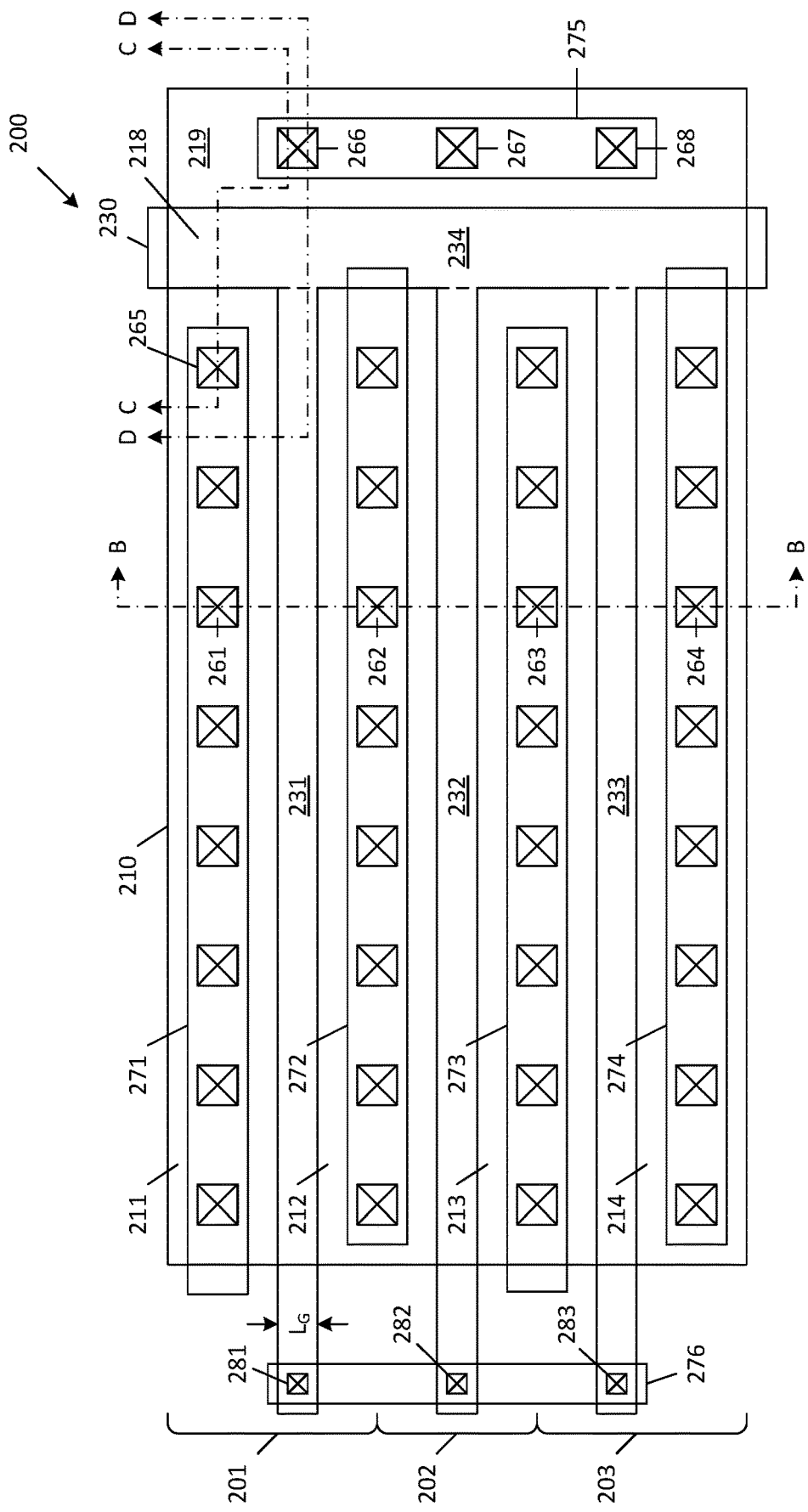
FIG. 2A is a top layout view of a conventional RF switch structure that uses conventional SOI CMOS transistors to implement the RF switch of FIG. 1.
Figure 2B:
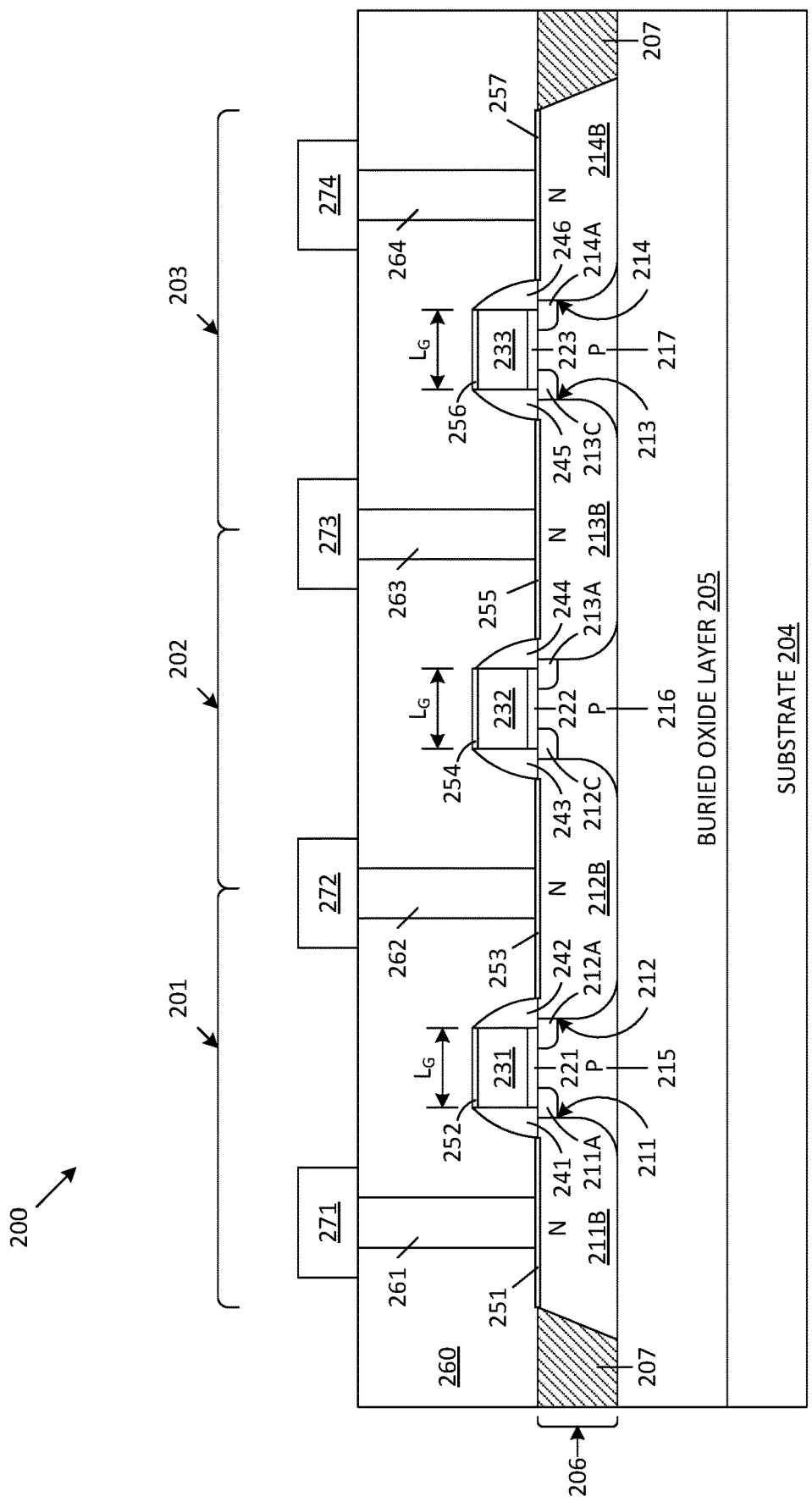
FIG. 2B is a cross sectional view along section line B-B of FIG. 2A.
Figure 2C:
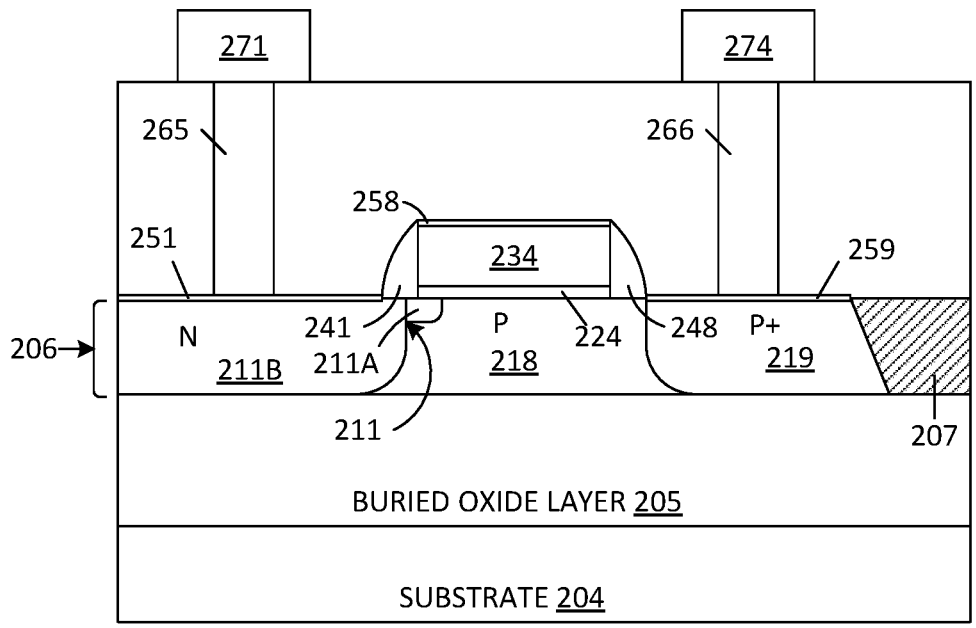
FIG. 2C is a cross sectional view along section line C-C of FIG. 2A.
Figure 2D:
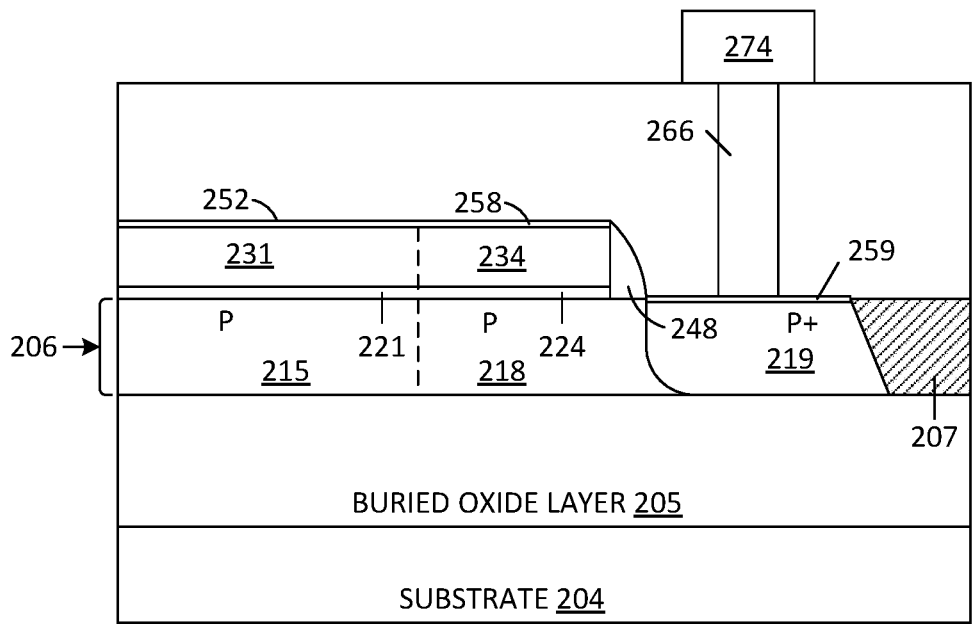
FIG. 2D is a cross sectional view along section line D-D of FIG. 2A.
Figure 2E:
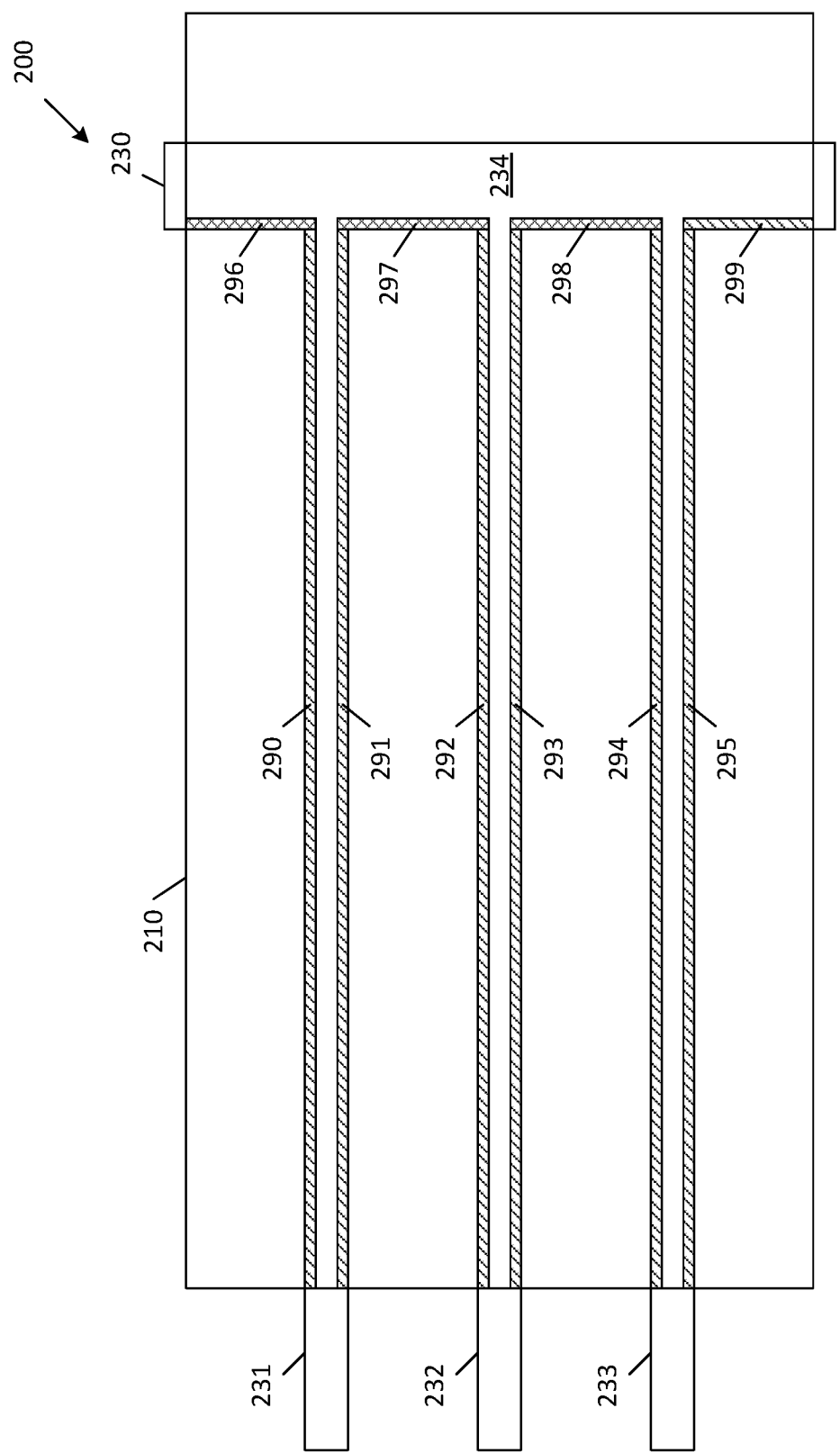
FIG. 2E is a simplified top layout view of the structure of FIG. 2A, illustrating areas of overlap between a polysilicon gate structure and underlying lightly doped source/drain regions.
Figure 3A:
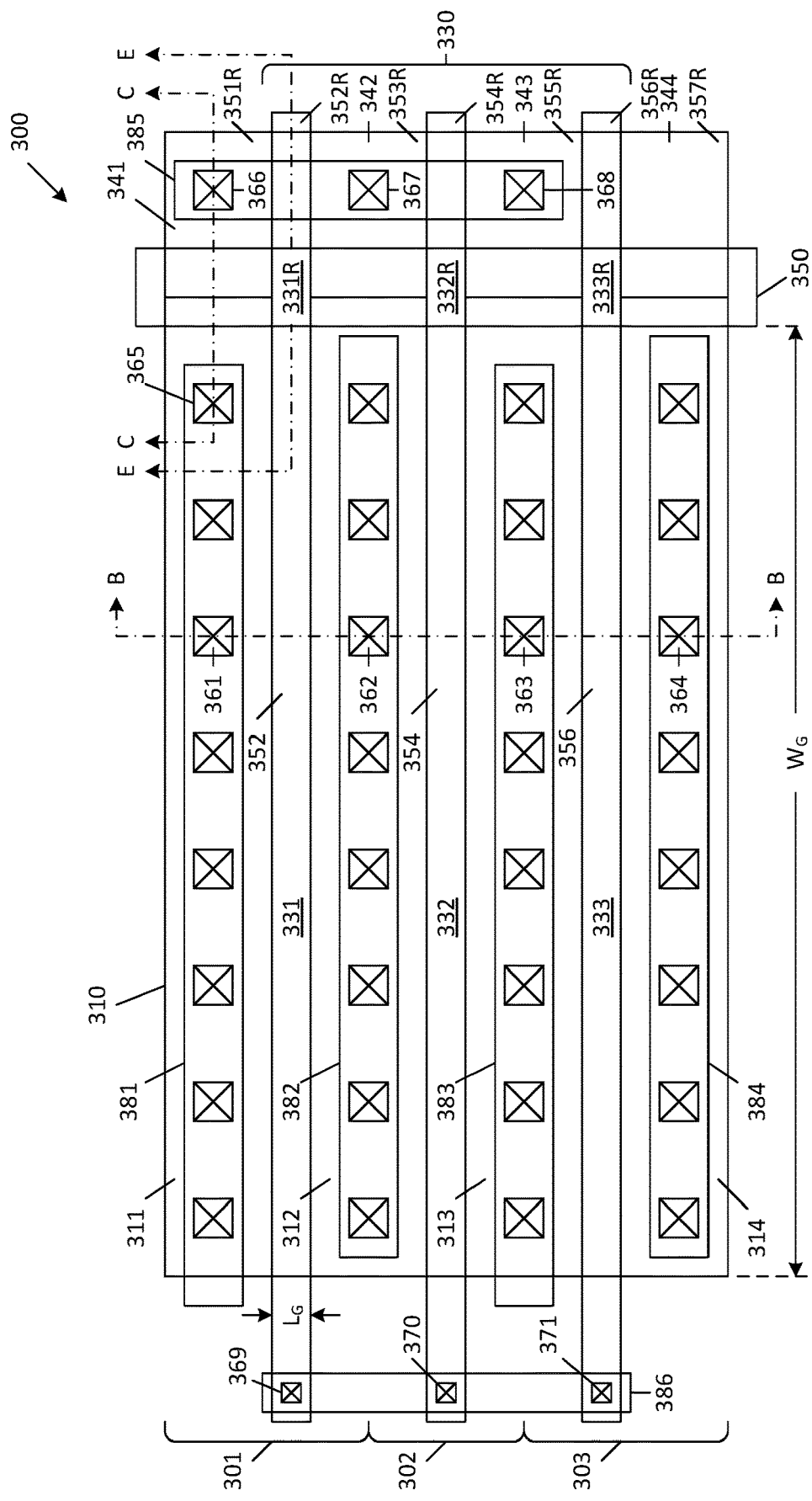
FIG. 3A is a top layout view of a SOI CMOS transistor structure that includes series-connected n-channel SOI CMOS transistors in accordance with one embodiment of the present invention.
Figure 3B:
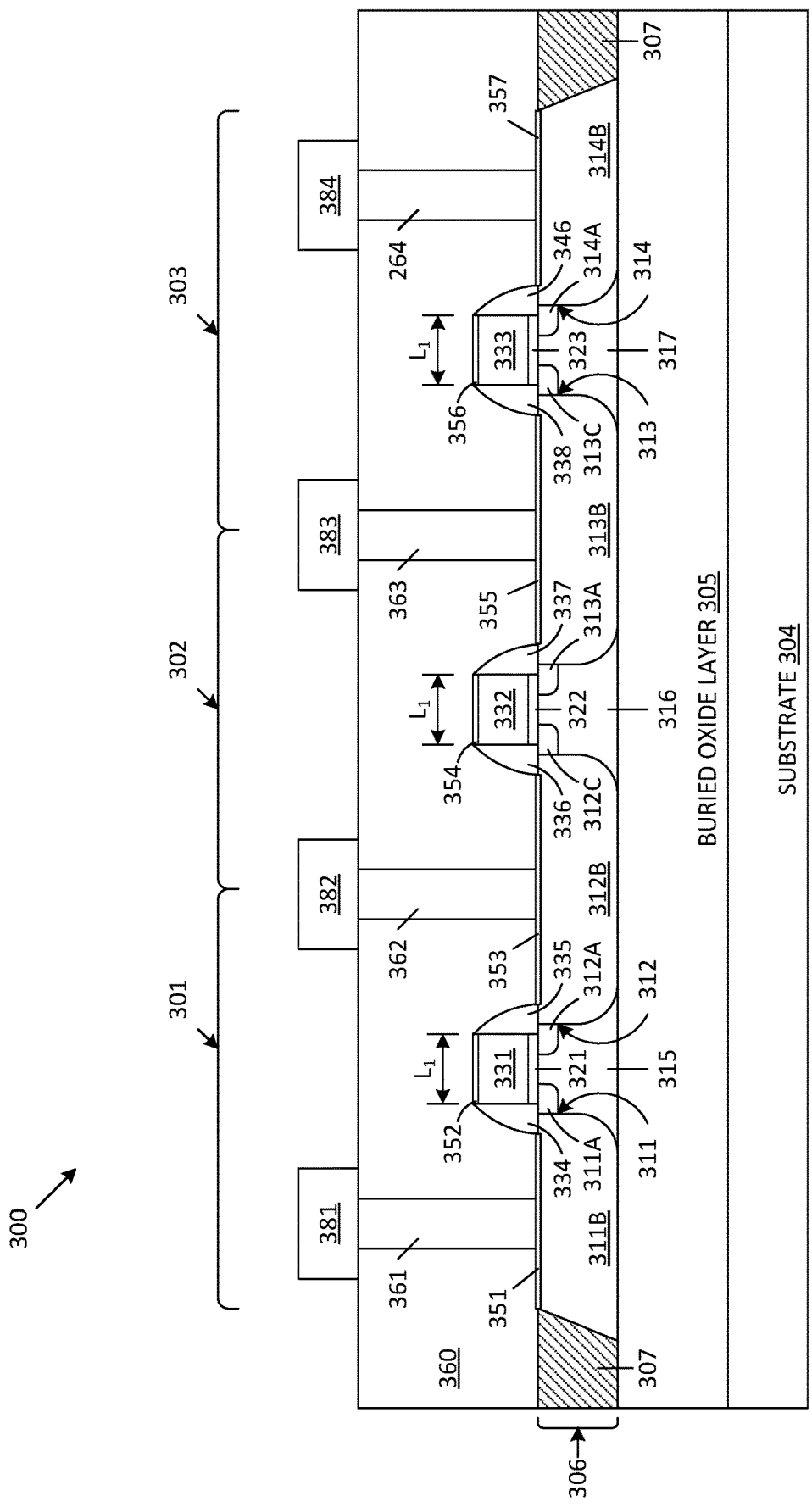
FIG. 3B is a cross sectional view of the SOI CMOS transistors of FIG. 3A along section line B-B.
Figure 3C:
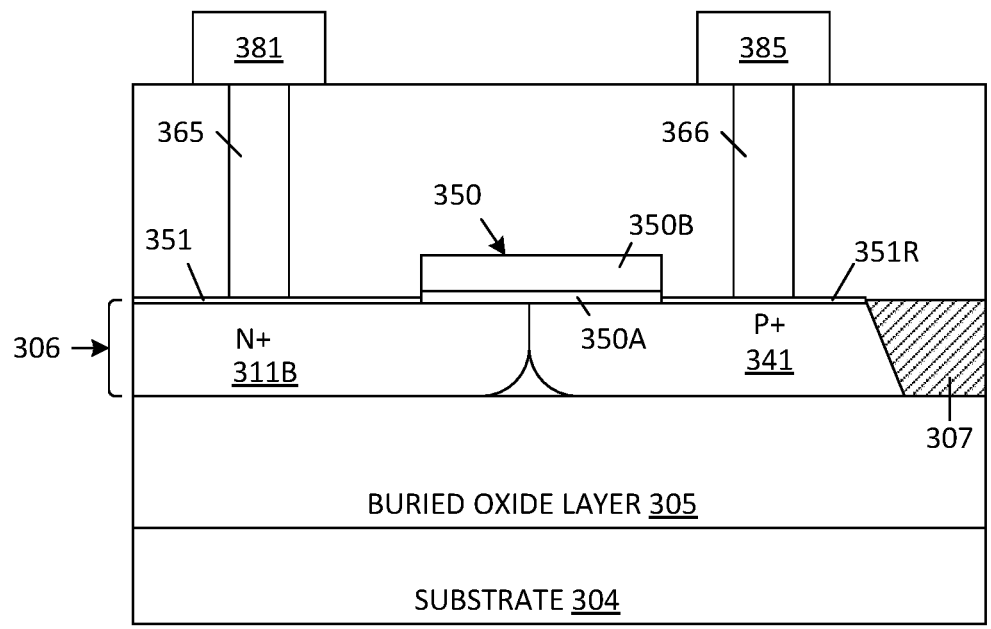
FIG. 3C is a cross sectional view of the SOI CMOS transistors of FIG. 3A along section line C-C.
Figure 3D:
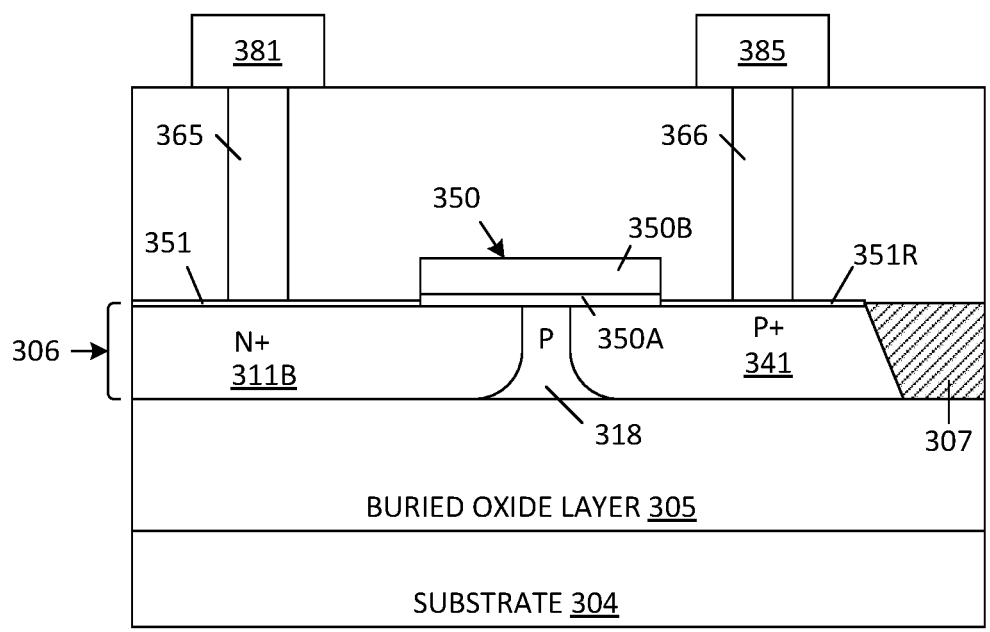
FIG. 3D is a cross sectional view of the SOI CMOS transistors of FIG. 3A along section line C-C, in accordance with an alternate embodiment of the present invention.
Figure 3E:
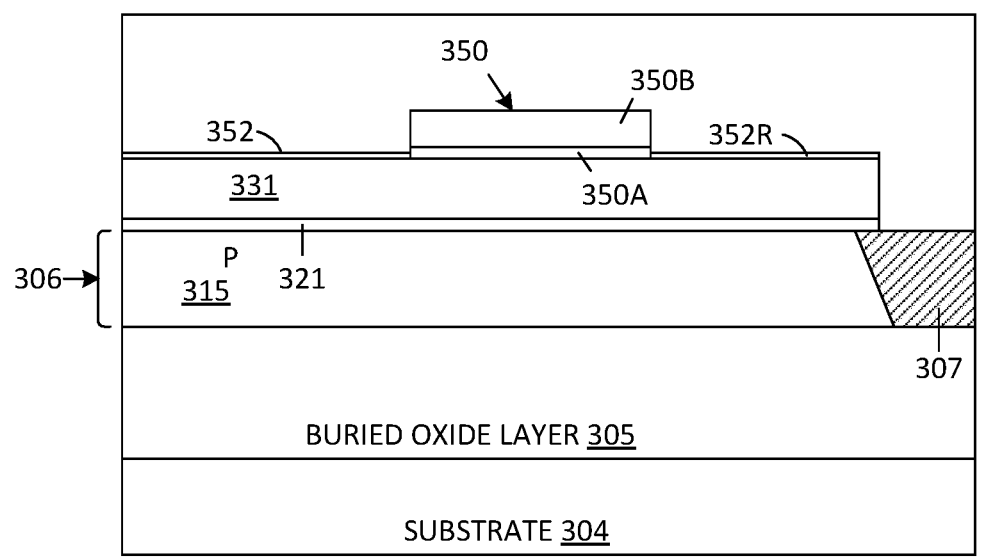
FIG. 3E is a cross sectional view of the SOI CMOS transistors of FIG. 3A along section line E-E.

FIG. 3A is a top view of a SOI CMOS transistor structure 300, which includes n-channel SOI CMOS transistors 301-303, which are fabricated in an active semiconductor region 310 using a conventional 0.18 micron SOI CMOS process node. FIG. 3B is a cross-sectional view of SOI CMOS structure 300 along section line B-B of FIG. 3A. FIG. 3C is a cross-sectional view of SOI CMOS structure 300 along section line C-C of FIG. 3A. FIG. 3E is a cross-sectional view of SOI CMOS structure 300 along section line E-E of FIG. 3A. Note that not all of the elements of SOI CMOS structure 300 are shown in FIG. 3A for clarity. In accordance with one embodiment of the present invention, transistors similar to n-channel SOI CMOS transistors 301-303 are used to implement transistors $110_1$-$110_N$ and $120_1$-$120_N$ of RF switches 110 and 120 (FIG. 1). Note that although only three transistors 301-303 are illustrated by FIGS. 3A-3C and 3E, the disclosed structure 300 can be readily expanded to implement other numbers of series-connected transistors, as required by the particular application. Also note that while n-channel devices 301-303 are described, it is understood that p-channel devices can be implemented by switching the conductivity types of the various regions.

The SOI CMOS transistor structure 300 of FIGS. 3A-3C and 3E is similar to the SOI CMOS transistor structure 200 of FIGS. 2A-2D, with the main difference being that the polysilicon gate structure 330 of FIGS. 3A-3C and 3E is different than the polysilicon gate structure 230 of FIGS. 2A-2D. More specifically, polysilicon gate structure 330 includes a plurality of rectangular polysilicon gate fingers 331-333. The rectangular polysilicon gate fingers 331-333 extend in parallel with one another over the entire width of the active region 310. Note that polysilicon gate structure 330 does not include a rectangular polysilicon region (such as the polysilicon region 234 of polysilicon gate structure 230), to join the ends of the polysilicon gate fingers 331-333.

As illustrated by FIG. 3B, SOI CMOS transistors 301-303 are fabricated on a thin silicon layer 306, which is located on a buried insulating layer 305 (e.g., silicon oxide), which in turn, is located on a substrate 304 (e.g., monocrystalline silicon). The active region 310, which is surrounded by shallow trench isolation region 307, is formed in thin silicon layer 306. In a particular embodiment, thin silicon layer 306 has a thickness in a range of about 300 to 2000 Angstroms.

N-channel SOI CMOS transistor 301 includes an n-type source/drain region 311 (which includes lightly doped source/drain region 311A and source/drain contact region 311B), an n-type source/drain region 312 (which includes lightly doped source/drain region 312A and source/drain contact region 312B), gate dielectric 321, polysilicon gate finger 331, dielectric sidewall spacers 334-335 and metal silicide regions 351-353. A p-type channel region 315 exists between the source/drain region 311 and the source/drain region 312.

N-channel SOI CMOS transistor 302 includes an n-type source/drain region 312 (which includes lightly doped source/drain region 312C and source/drain contact region 312B), an n-type source/drain region 313 (which includes lightly doped source/drain region 313A and source/drain contact region 313B), gate dielectric 322, polysilicon gate finger 332, dielectric sidewall spacers 336-337 and metal silicide regions 353-355. A p-type channel region 316 exists between the source/drain region 312 and the source/drain region 313.

N-channel SOI CMOS transistor 303 includes an n-type source/drain region 313 (which includes lightly doped source/drain region 313C and source/drain contact region 313B), an n-type source/drain region 314 (which includes lightly doped source/drain region 314A and source/drain contact region 314B), gate dielectric 323, polysilicon gate finger 333, dielectric sidewall spacers 338-339 and metal silicide regions 355-357. A p-type channel region 317 exists between the source/drain region 313 and the source/drain region 314.

P-type channel/body contact regions 341-344 are continuous with the p-type channel regions 315-317 at the right side of the active region 310, thereby providing a path for biasing the p-type channel/body regions 315-317.

Dielectric sidewall spacers 334-335, 336-337 and 338-339 are formed adjacent to (and along the entire lengths of) polysilicon gate fingers 331, 332 and 333, respectively. Metal silicide regions 351, 352, 353, 354, 355, 356 and 357 are formed over source/drain region 311, gate finger 331, source/drain region 312, gate finger 332, source/drain region 313, gate finger 333 and source/drain region 314, respectively. Metal silicide regions 352R, 354R and 356R are also formed over the right ends of polysilicon gate fingers 331, 332 and 333, respectively. A silicide blocking mask 350 prevents the formation of metal silicide over regions 331R, 332R and 333R of polysilicon gate fingers 331, 332 and 333, respectively. Silicide blocking mask 350 also prevents the formation of metal silicide over the right edges of n-type source/drain contact regions 311B, 312B, 313B and 314B, and the left edges of p-type channel/body contact regions 341-344. The right edges of p-type channel/body contact regions 341-344 are not covered by silicide blocking mask 350, allowing metal silicide regions 351R, 353R, 355R and 357R are formed over the exposed portions of p-type channel/body contact regions 341-344, as illustrated. Although FIG. 3C indicates that the right edges of n-type source/drain contact regions 311B, 312B, 313B and 314B abut the left edges of p-type channel/body contact regions 341-344, it is understood that a gap (e.g., portions of p-type channel/body region 315-317) may exist between the right edges of n-type source/drain contact regions 311B, 312B, 313B and 314B and the left edges of p-type channel/body contact regions 341-344 in other embodiments. FIG. 3D illustrates such an embodiment, wherein p-type channel/body extension region 318 (which is continuous with the p-type channel/body regions 315-317) is located between the right edges of n-type source/drain contact regions 311B, 312B, 313B and 314B and the left edges of p-type channel/body contact regions 341-344.

A multi-layer interconnect structure is fabricated over transistors 301-303, thereby providing electrical connections to these transistors (and other devices fabricated in the thin silicon layer 306). In the example illustrated, a pre-metal dielectric (PMD) structure 360 is formed over transistors 301-303. Metal contacts (which are illustrated as squares containing an "X" in FIG. 3A), such as contacts 361-365, extend through the PMD structure 360 and contact the silicide regions 351, 353, 355, 357 and 351, respectively, as illustrated. Metal contacts 366-368 extend through the PMD structure 360 and contact the silicide regions 351R, 353R and 355R, respectively, as illustrated. Metal contacts 369-371 extend through the PMD structure and contact the silicide regions 352, 354 and 356, respectively, thereby providing electrical connections to polysilicon gate fingers 331-333.

A first metal layer (M1), including metal traces 381-386, is formed over PMD structure 360. Additional dielectric layers, metal vias and metal layers (not shown) are formed over the PMD structure 360 and the first metal layer (M1) in a manner known in the art. Metal trace 381 is formed on the metal contacts (including metal contacts 361 and 365) coupled to metal silicide region 351). Metal trace 382 is formed on the metal contacts (including metal contact 362) that are coupled to metal silicide region 353. Metal trace 383 is formed on the metal contacts (including metal contact 363) coupled to metal silicide region 355. Metal trace 384 is formed on the metal contacts (including metal contact 364) coupled to metal silicide region 357. Metal trace 385 is formed on metal contacts 366-368. Metal trace 386 is formed on metal contacts 369-371.

Figure 3F:
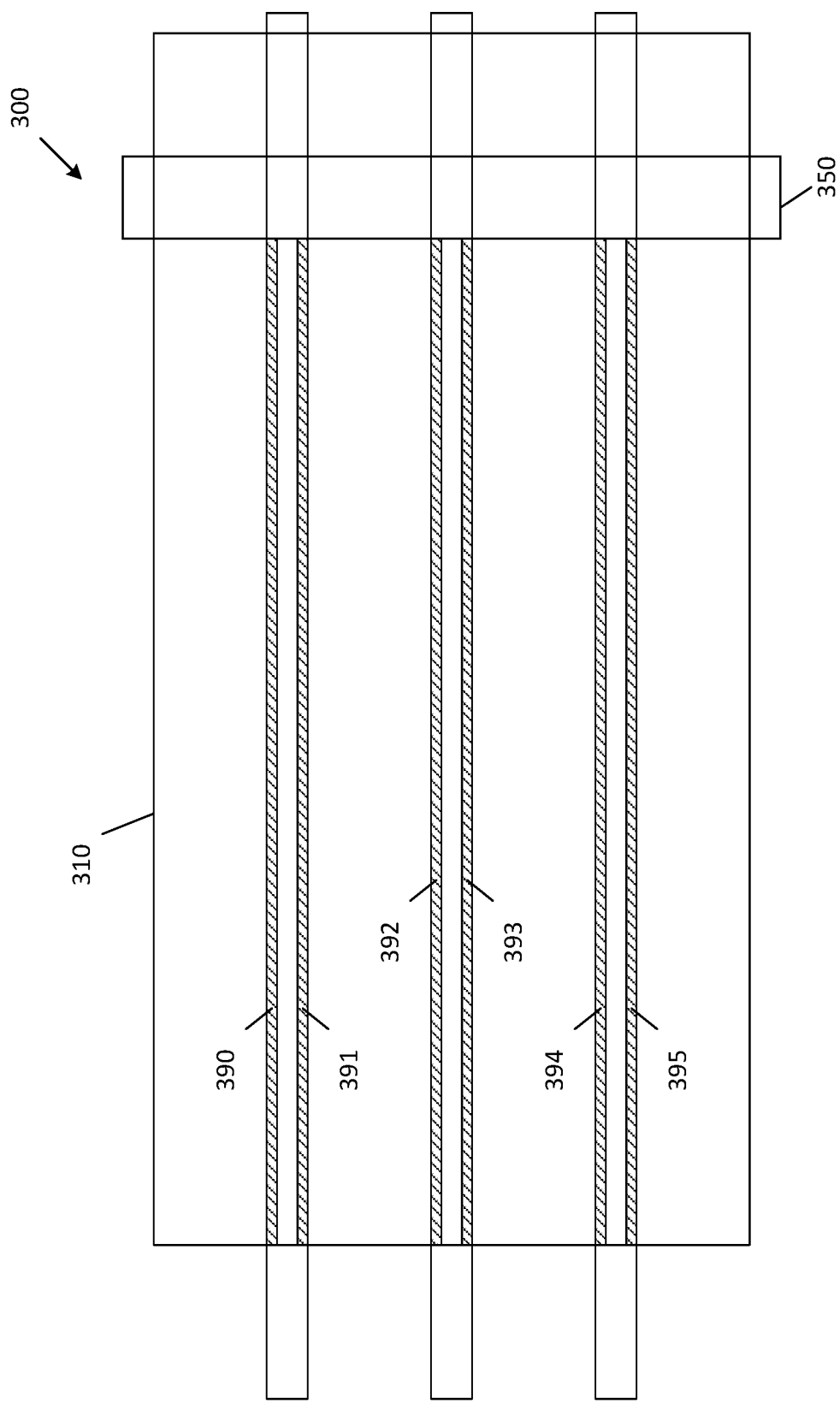
FIG. 3F is a simplified top layout view of the structure of FIG. 3A, illustrating areas of overlap between a polysilicon gate structure and underlying lightly doped source/drain regions.

A bias voltage applied to metal trace 385 is provided to the p-type channel/body regions 315-317 of re-channel transistors 301-303 (via metal contacts 366-368, silicide regions 351R, 353R and 355R, and p-type channel/body contact regions 341-343). Advantageously, the lightly doped source drain regions of transistors 301-303 only extend under the polysilicon gate fingers 331-333 over the width $W_G$ of the silicided polysilicon gate fingers 331-333. FIG. 3F is a simplified top layout view of the structure 300, including active region 310, polysilicon gate fingers 331-333 and silicide blocking structure 350. Shaded regions 390-395 represent the overlap regions where the silicided polysilicon gate fingers 331-333 extend over the underlying lightly doped source/drain regions 311A, 312A, 312C, 313A, 313C and 314A. Thus, overlap regions 390-391, 392-393 and 394-395 exist under polysilicon gate fingers 331, 332 and 333, respectively. Assuming that the SOI CMOS transistor structures 300 and 200 have similar gate lengths $L_G$ and gate widths $W_G$, the overlap regions 390-395 of SOI CMOS transistor structure 300 are advantageously smaller than the overlap regions 290-299 of SOI CMOS transistor structure 200. More specifically, overlap regions 390-395 of SOI CMOS transistor structure 300 are substantially identical to overlap regions 290-295 of SOI CMOS transistor structure 200, while overlap regions 296-299 of SOI CMOS transistor structure 200 represent additional overlap regions, which are not included in SOI CMOS transistor structure 300. As a result, SOI CMOS transistor structure 300 exhibits a lower overlap capacitance (and therefore a lower off-capacitance $C_{OFF}$) than SOI CMOS transistor structure 200.

In accordance with one embodiment, transistors 301-303 and the associated multi-layer interconnect structure are fabricated in accordance with a conventional 0.18 micron SOI CMOS process node.

To implement a RF switch, each of the polysilicon gate fingers 331-333 may have a length ($L_G$) of 0.18 microns or more. In accordance with one embodiment, each of the polysilicon gate fingers 331-333 has a length ($L_G$) of about 0.19 microns. The width ($W_G$) of each of the polysilicon gate fingers 331-333 over the active region can be, for example, 7 to 20 microns. In a particular embodiment, each of the polysilicon gate fingers 331-333 has a width ($W_G$) of about 15 microns and a length ($L_G$) of about 0.19 microns.

Note that as the gate width $W_G$ increases, the breakdown voltage of the associated SOI transistors 301-303 decreases. To compensate for this decrease in breakdown voltage, the structure of SOI CMOS transistor 300 can be modified to mirror the right side structure of SOI CMOS transistor 300 to the left side of SOI CMOS transistor 300. In this embodiment, the p-type channel/body regions 315-317 of transistors 301-303 can be biased from both the left and right sides of the SOI CMOS transistor structure, thereby helping to maintain a relatively high breakdown voltage for each of the transistors 301-303.

Figure 3G:
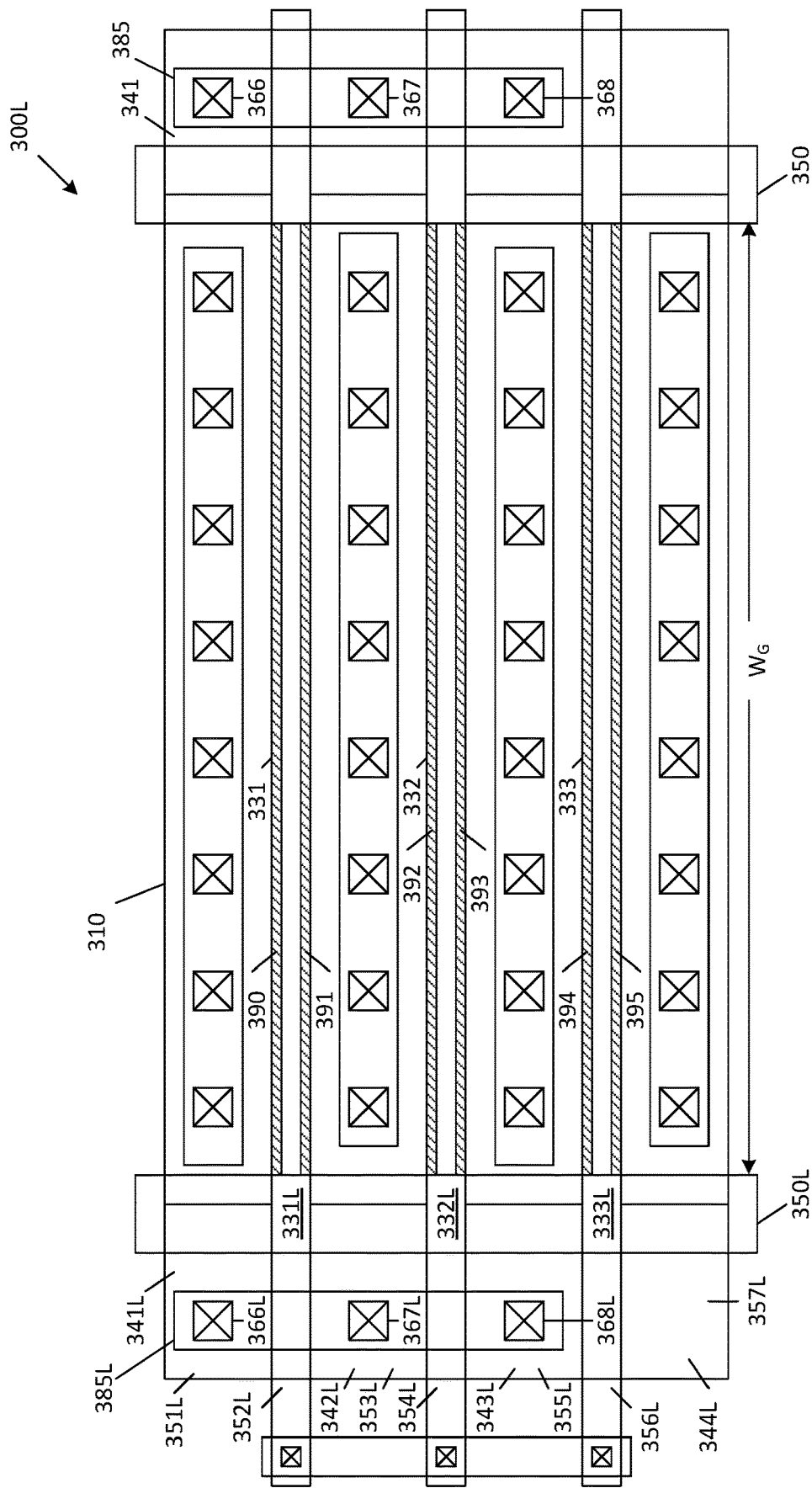
FIG. 3G is a simplified top layout view of a SOI CMOS transistor structure that mirrors the right side structure of the SOI CMOS transistor of FIG. 3A to the left side of the SOI CMOS transistor structure in accordance with one embodiment of the present invention.

FIG. 3G is a simplified top layout view of a SOI CMOS transistor structure 300A that mirrors the right side structure of SOI CMOS transistor 300 to the left side of the SOI CMOS transistor structure in accordance with one embodiment of the present invention. In this embodiment, modified SOI CMOS transistor structure 300A adds a second silicide blocking structure 350L (which is similar to silicide blocking structure 350), p-type regions 341L-344L (which are similar to p-type regions 341-344, respectively), metal silicide regions 351L-357L (which are similar to metal silicide regions 351R-357R), metal contacts 366L-368L (which are similar to metal contacts 366-368), and metal trace 385L (which is similar to metal trace 385) to the left side of the SOI transistor 300 of FIG. 3A. Silicide blocking structure 350L prevents the formation of metal silicide over the regions 331L-333L of polysilicon gate fingers 331-333 (similar to the manner in which silicide blocking structure 350 prevents the formation of metal silicide over regions 331R-333R of polysilicon gate fingers 331-333). Note that various elements of SOI transistor structure 300 are present, but not shown, in FIG. 3G for purposes of clarity. That is, SOI CMOS transistor structure 300A includes all of the above-described elements of SOI CMOS transistor structure 300, even though these elements may not be shown in FIG. 3G. It is understood that SOI CMOS transistor structure 300A allows the p-type channel/body regions 315-317 of SOI transistors 301-303 to be simultaneously biased from the left and right sides by applying bias voltages to metal traces 385 and 385L, thereby maintaining relatively high breakdown voltages for these SOI transistors 301-303. As illustrated by FIG. 3G, assuming that the gate width $W_G$ remains the same in FIGS. 3F and 3G, the addition of the silicide blocking region 350L and p-type regions 341L-343L to the left side of the structure do not increase the overlap regions 390-395 of the polysilicon gate fingers 331-333. As a result, the overlap capacitance associated with SOI CMOS transistor structure 300A is substantially identical to the overlap capacitance associated with SOI CMOS transistor structure 300. Note that in an alternate embodiment, the right side structure of FIG. 3D can be mirrored to the left side of the SOI CMOS transistor structure.

Figure 4:
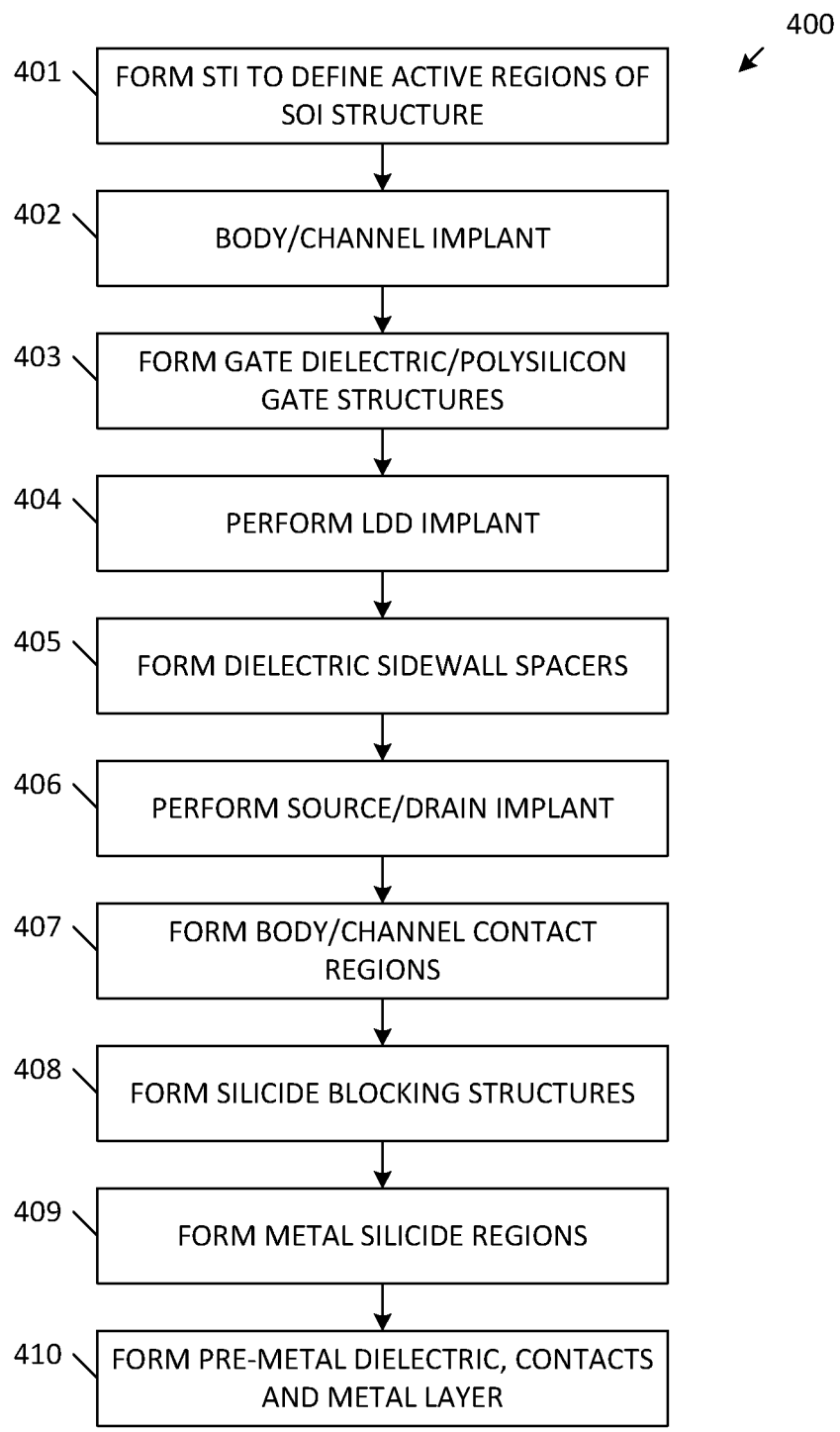
FIG. 4 is a flow diagram illustrating a method of fabricating the SOI CMOS transistor structure of FIGS. 3A-3G, in accordance with one embodiment of the present invention.

Other embodiments include methods for fabricating the SOI transistor structures 300/300A described above. FIG. 4 is a flow diagram illustrating a method 400 for fabricating SOI CMOS transistor structures 300/300A in accordance with one embodiment. In this embodiment, shallow trench isolation (STI) region 307 is formed (step 401), thereby defining active region 310 within thin silicon layer 306. A p-type body implant is performed into active region 310 (step 402), thereby introducing p-type dopant into regions that will eventually become p-type channel/body regions 315-317, p-type channel/body contact regions 341-344 and 341L-344L.

A gate dielectric layer (which eventually forms gate dielectric structures 321-323) is then formed over active region 310. A polysilicon layer (which eventually forms polysilicon gate fingers 331-333) is then formed over the gate dielectric layer. A mask is formed over the polysilicon layer, and series of etches is performed through the mask, thereby forming gate dielectric structures 321-323 and polysilicon gate fingers 331-333 (step 403).

An n-type LDD implant mask is then formed over the resulting structure, wherein the LDD implant mask covers the areas where p-type channel/body contact regions 341-344 and 341L-344L are to be formed. An N-type LDD implant is performed through the n-type LDD implant mask, thereby forming lightly doped source/drain regions 311A, 312A, 312C, 313A, 313C and 314A (step 404).

The n-type LDD implant mask is removed, and dielectric sidewall spacers 334-339 are formed adjacent to polysilicon gate fingers 331-333 (step 405). An n-type source/drain implant mask is then formed over the resulting structure, wherein the n-type source/drain mask covers the areas where p-type channel/body contact regions 341-344 and 341L-344L are to be formed, and exposes the remainder of active region 310. An N+ type implant is performed through the n-type source/drain implant mask, thereby forming n-type source/drain regions 311B, 312B, 313B and 314B (step 406). The n-type source/drain implant mask is then removed.

A p-type source/drain implant mask (which is used to form p-type source/drain contact regions of p-channel transistors (not shown) fabricated on the same substrate) is formed over the resulting structure. The p-type source/drain implant mask exposes the areas where p-type regions 341-344 and 341L-344L are to be formed, but covers the remainder of active region 310. A P+ type implant is performed through the p-type source/drain implant mask, thereby forming p-type channel/body contact regions 341-344 and 341L-344L (step 407). The p-type source/drain implant mask is then removed.

Silicide blocking structures 350/350L are then formed over the resulting structure (step 408). In one embodiment, silicide blocking structures 350/350L are formed by depositing a layer of silicon oxide having a thickness of about 50 Angstroms, depositing a layer of silicon nitride having a thickness of about 300 Angstroms over the silicon oxide layer, and then patterning the silicon oxide layer and silicon nitride layer to form silicide blocking structures 350/350L. Note that each of the silicide blocking structures 350/350L is located such that it extends over the regions wherein the p-type channel/body contact regions 341-344 and 341L-344L adjoin the corresponding n-type source/drain contact regions 311B, 312B, 313B and 314B.

A layer of refractory metal, such as titanium, tungsten, nickel or cobalt, is deposited over the resulting structure. The refractory metal layer is annealed, thereby forming metal silicide regions 351-359, 351A-357A and 351L-357L on the corresponding underlying silicon regions (step 409). Unreacted portions of the refractory metal layer are removed, and then pre-metal dielectric structure 360, metal contacts 361-371 and first metal layer traces 381-386 are formed (step 410).

Although the invention has been described in connection with several embodiments, it is understood that this invention is not limited to the embodiments disclosed, but is capable of various modifications, which would be apparent to a person skilled in the art. Thus, the invention is limited only by the following claims.

I claim:
1. A method comprising:
forming a plurality of polysilicon gate electrodes over an active region of a silicon-on-insulator structure;
forming a plurality of source/drain regions having a first conductivity type in the active region, wherein a plurality of channel/body regions having a second conductivity type exist in the active region, wherein each of the plurality of channel/body regions is located under a corresponding one of the polysilicon gate electrodes, and wherein each of the plurality of channel/body regions is located between adjacent pairs of the plurality of source/drain regions;
forming a first plurality of contact regions having the second conductivity type, wherein the first plurality of contact regions are continuous with first ends of the plurality of channel/body regions, wherein the plurality of polysilicon gate electrode extends between the first plurality of contact regions; then
forming a silicide blocking structure that covers first portions of the first plurality of contact regions, adjacent first portions of the source/drain regions, and first portions of each of the plurality of polysilicon gate electrodes; and then forming metal silicide regions over portions of the plurality of source/drain regions, portions of the first plurality of contact regions and portions of the polysilicon gate electrodes that are not covered by the silicide blocking structure.

2. The method of claim 1, further comprising forming a second plurality of contact regions having the second conductivity type, wherein the second plurality of contact regions are continuous with second ends of the plurality of channel/body regions, wherein the first ends and the second ends of the plurality of channel/body regions are opposite ends of the channel/body regions.

3. The method of claim 2, further comprising forming a second silicide blocking structure that covers first portions of the second plurality of contact regions, adjacent second portions of the source/drain regions, and second portions of each of the plurality of polysilicon gate electrodes.

4. The method of claim 3, further comprising forming metal silicide regions over portions of the second plurality of contact regions and portions of the polysilicon gate electrodes that are not covered by the second silicide blocking structure.

5. The method of claim 1, further comprising forming an isolation structure that laterally surrounds the active region.

6. The method of claim 1, wherein the first portions of the plurality of source/drain regions abut the first portions of the first plurality of contact regions.

7. The method of claim 1, wherein portions of the plurality of channel/body regions are located between the plurality of source/drain regions and the first plurality of contact regions.

8. The method of claim 1, further comprising forming one or more of the first plurality of contact regions between the polysilicon gate electrodes.

* * * * *